United States Patent
Yamamoto et al.

(10) Patent No.: US 10,861,683 B2
(45) Date of Patent: Dec. 8, 2020

(54) VACUUM DEVICE

(71) Applicant: MURATA MANUFACTURING CO., LTD., Kyoto-fu (JP)

(72) Inventors: Issei Yamamoto, Nagaokakyo (JP); Atsushi Shimizu, Nagaokakyo (JP); Yoichi Takagi, Nagaokakyo (JP); Hideo Nakagoshi, Nagaokakyo (JP); Toru Komatsu, Nagaokakyo (JP); Hideki Shinkai, Nagaokakyo (JP); Tetsuya Oda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/427,721

(22) Filed: Feb. 8, 2017

(65) Prior Publication Data

US 2017/0250061 A1 Aug. 31, 2017

(30) Foreign Application Priority Data

Feb. 26, 2016 (JP) ................... 2016-036436

(51) Int. Cl.
*C23C 14/34* (2006.01)
*H01J 37/34* (2006.01)
(Continued)

(52) U.S. Cl.
CPC ........ *H01J 37/3411* (2013.01); *C23C 14/205* (2013.01); *C23C 14/50* (2013.01);
(Continued)

(58) Field of Classification Search
CPC ............... H01J 37/3435; H01J 37/3274; H01J 37/32724
See application file for complete search history.

(56) References Cited

U.S. PATENT DOCUMENTS

| 4,441,974 A * | 4/1984 | Nishikawa .......... H01J 37/3405 |
| | | 204/192.12 |
| 5,597,458 A * | 1/1997 | Sanchez, Jr. .......... C23C 14/165 |
| | | 204/192.12 |

(Continued)

FOREIGN PATENT DOCUMENTS

| CN | 1992162 A | 7/2007 |
| JP | H11-251413 A | 9/1999 |

(Continued)

OTHER PUBLICATIONS

An Office Action; "Notification of Preliminary Rejection," issued by the Korean Intellectual Property Office dated Feb. 12, 2018, which corresponds to Korean Patent Application No. 10-2017-0024338 and is related to U.S. Appl. No. 15/427,721.

(Continued)

*Primary Examiner* — Jason Berman
(74) *Attorney, Agent, or Firm* — Studebaker & Brackett PC (57) ABSTRACT

A vacuum device includes a processing target placement unit that is arranged inside a vacuum chamber and a vacuum evacuation unit that is connected to the vacuum chamber. The processing target placement unit has one main surface on which processing targets are placed and a side surface that is connected to the one main surface. The processing target placement unit is provided with a plurality of grooves that have openings at the one main surface. When the processing target placement unit is viewed from the one main surface side thereof, the smallest width of the opening of each groove in the one main surface is equal to or less than half the smallest width of the processing target.

8 Claims, 9 Drawing Sheets

(51) Int. Cl.
C23C 14/50 (2006.01)
C23C 14/20 (2006.01)
H01J 37/32 (2006.01)

(52) U.S. Cl.
CPC .... *H01J 37/32724* (2013.01); *H01J 37/3435* (2013.01); *H01J 37/3476* (2013.01)

(56) References Cited

U.S. PATENT DOCUMENTS

| | | | | |
|---|---|---|---|---|
| 5,650,378 | A | * | 7/1997 | Iijima .................. C23C 14/083 204/192.11 |
| 6,077,357 | A | * | 6/2000 | Rossman ............ C23C 16/4585 118/723 R |
| 2008/0173541 | A1 | * | 7/2008 | Lee ..................... C23C 14/3407 204/298.12 |
| 2010/0330709 | A1 | * | 12/2010 | Kandatsu ............... C23C 14/48 438/5 |
| 2013/0277204 | A1 | * | 10/2013 | Mikalo ............... C23C 14/3407 204/192.1 |

FOREIGN PATENT DOCUMENTS

| | | |
|---|---|---|
| JP | 2002-270681 A | 9/2002 |
| JP | 2007-201404 A | 8/2007 |
| JP | 2009-272515 A | 11/2009 |
| JP | 2012-149345 A | 8/2012 |
| JP | 2013-129723 A | 7/2013 |
| JP | 2015-198157 A | 11/2015 |
| KR | 10-2003-0063448 A | 7/2003 |
| KR | 10-1324711 B1 | 11/2013 |
| WO | 2013/175987 A1 | 11/2013 |

OTHER PUBLICATIONS

An Office Action; "Notification of Reasons for Refusal," Mailed by the Japanese Patent Office dated Feb. 5, 2019, which corresponds to Japanese Patent Application No. 2016-036436 and is related to U.S. Appl. No. 15/427,721; with English language translation.

An Office Action; "Notification of Reasons for Refusal," Mailed by the Japanese Patent Office dated Jul. 24, 2018 , which corresponds to Japanese Patent Application No. 2016-036436 and is related to U.S. Appl. No. 15/427,721; with English language translation.

An Office Action mailed by the China National Intellectual Property Administration dated Dec. 31, 2019, which corresponds to Chinese Patent Application No. 201710102611.0 and is related to U.S. Appl. No. 15/427,721 with English language translation.

An Office Action mailed by the China National Intellectual Property Administration dated Jul. 10, 2020, which corresponds to Chinese Patent Application No. 201710102611.0 and is related to U.S. Appl. No. 15/427,721 with English language translation.

* cited by examiner

VACUUM DEVICE

CROSS REFERENCE TO RELATED APPLICATIONS

This application claims benefit of priority to Japanese Patent Application 2016-036436 filed Feb. 26, 2016, the entire content of which is incorporated herein by reference.

TECHNICAL FIELD

The present disclosure relates to a vacuum device and particularly relates to a vacuum device that is used when performing a sputtering process, a plasma process or the like on a processing target such as an electronic component.

BACKGROUND

In recent years, there has been a problem of noise interference between electronic components due to the increasing number of electronic components used in electronic devices such as multifunction cellular phones and the increasing mounting density of electronic components caused by reductions in the size of electronic devices. Consequently formation of a shield film for protecting functional parts from noise is often required in communication module products (hereafter, may be simply referred to as products), which are one of the above-mentioned electronic components. A sputtering device is used to form such a shield film, for example. A sputtering process is performed in a high vacuum and such products reach a high temperature during the sputtering process.

A technique has been proposed in which a sputtering process is performed by placing such product on a processing target placement unit having a cooling unit in order to lower the temperature of the product during the sputtering process. In this case, in order to make the product closely contact the processing target placement unit and to ensure that thermal conduction occurs therebetween, the product may be affixed to the processing target placement unit by using double-sided adhesive tape, for example. However, air sometimes remains in parts of the region between the processing target placement unit and the double-sided adhesive tape when the double-sided adhesive tape is affixed to the processing target placement unit. When a sputtering process is performed in a high vacuum without first resolving this situation, a problem occurs in that the air remaining between the processing target placement unit and the double-sided adhesive tape increases in volume and the product cannot be correctly held at the desired position.

It is possible to solve the above-described problem by providing grooves for allowing the air to escape in an upper surface of a substrate placement part in a processing target placement unit as disclosed in Japanese Unexamined Patent Application Publication No. 11-251413, for example.

Figure 8:
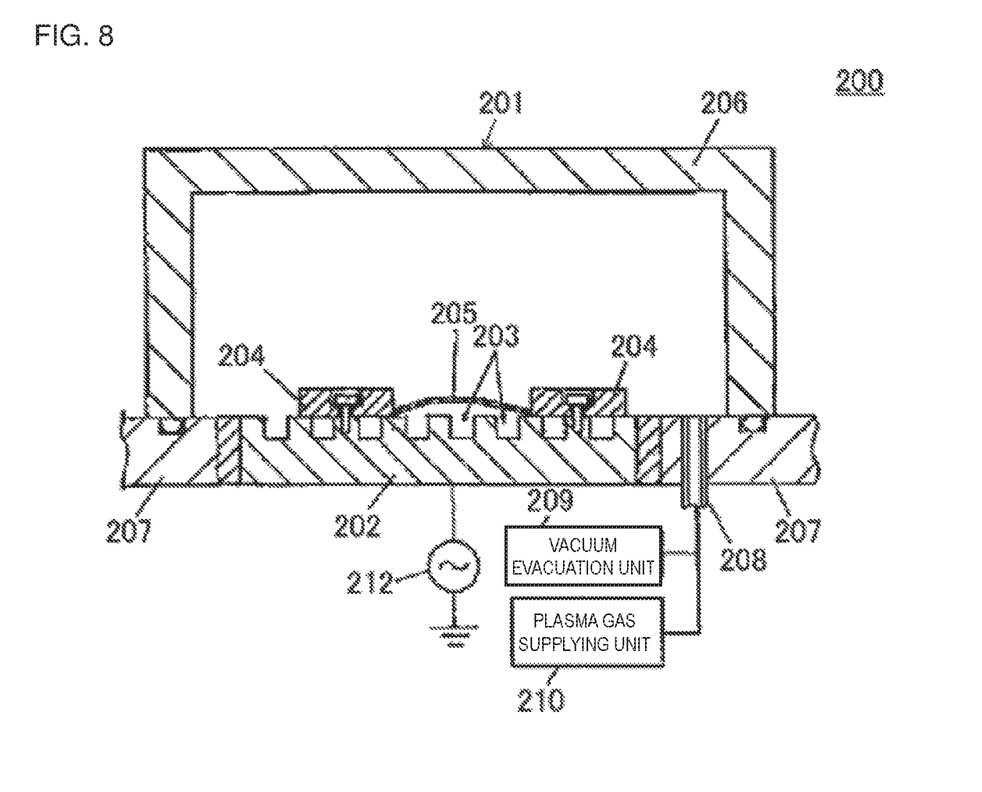
FIG. 8 is a sectional view of a vacuum device of the related art.

FIG. 8 is a sectional view of a vacuum device 200 disclosed in Japanese Unexamined Patent Application Publication No. 11-251413. In the vacuum device 200, a vacuum chamber 201 is formed of an electrode 202, which is a substrate placement part, a cover member 206 and a base member 207. The electrode 202 is connected to a high-frequency power supply 212. The base member 207 is provided with a pipe section 208. A vacuum evacuation unit 209, which functions as an evacuation unit, and a plasma gas supplying unit 210 are connected to the vacuum chamber 201 via the pipe section 208. A substrate 205 is fixed to an upper surface of the electrode 202 by guide members 204.

In the vacuum device 200 of FIG. 8, plasma generating gas is supplied to the inside of the vacuum chamber 201, which is in a high vacuum state, and a high-frequency voltage is applied to the electrode 202, and consequently, plasma is generated inside the vacuum chamber 201. Ions and electrons generated as a result of this collide with the surface of the substrate 205, and as a result the surface of the substrate 205 is subjected to a plasma process.

Here, a plurality of grooves 203, which are linear and are arranged one after another in a direction in which the substrate 205 is conveyed, are provided in the upper surface of the electrode 202. In this case, since air inside gaps between the upper surface of the electrode 202 and the lower surface of the substrate 205 can be quickly removed via the grooves 203, a pressure difference is not generated between the upper surface and the lower surface of the substrate 205 even in the case where there was air remaining in gaps between the upper surface of the electrode 202 and the lower surface of the substrate 205. Therefore, in the vacuum device 200, it is possible to prevent positional displacement of the substrate 205 at the time of vacuum evacuation that would be caused by such a pressure difference.

In other words, by providing grooves in a processing target placement unit, it would be possible to remove air remaining between the processing target placement unit and double-sided adhesive tape in the case where a product is affixed onto the processing target placement unit by using double-sided adhesive tape or the like as well. As a result, it is thought that the product could be correctly held at a desired position.

Figure 9:
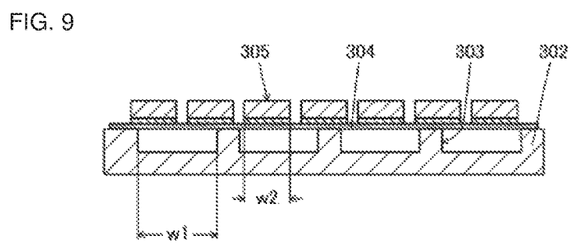
FIG. 9 is a sectional view of a processing target placement unit for explaining results of investigations carried out by the present inventors.

However, there is no mention of the width of the grooves 203 in the description given in Japanese Unexamined Patent Application Publication No. 11-251413. In recent years, since communication module components have been becoming ever smaller in size, it is possible that a product will be smaller in size than the width of the grooves. For example, as illustrated in FIG. 9, when products 305 having a width w2 that is smaller than a width w1 are affixed using double-sided adhesive tape 304 onto a processing target placement unit 302 provided with grooves 303 having the width w1, some of the products 305 are located above the grooves 303. In other words, when the processing target placement unit 302 is viewed from above, a state occurs in which these products 305 do not overlap parts of the processing target placement unit 302 where the grooves 303 are not formed.

There is insufficient thermal conduction between the processing target placement unit 302 and the products 305 in this case and therefore there is a risk that the products 305 will reach a high temperature during the sputtering process. If the products 305 reach a high temperature, there is a risk of resin parts of the products 305 composed of a molding resin or the like deforming due to thermal expansion, of solder connecting an electronic component to a substrate inside a product 305 re-melting and of the products 305 becoming defective.

SUMMARY

Accordingly, an object of the present disclosure is to provide a vacuum device that can perform a surface process such as a sputtering process or a plasma process in a state where a rise in temperature of a communication module is sufficiently suppressed even in the case where the communication module is small in size.

In preferred embodiments of the present disclosure, in order to ensure that a communication module can be subjected to a surface process in a vacuum in a state where an increase in the temperature of the communication module can be suppressed even in the case where the communication module is small in size, the form of grooves provided in a processing target placement unit on which a processing target is placed is improved.

According to a first embodiment of the present disclosure, a vacuum device includes a processing target placement unit that is arranged inside a vacuum chamber and a vacuum evacuation unit that is connected to the vacuum chamber. The processing target placement unit has one main surface on which a processing target is placed and a side surface that is connected to the one main surface. The processing target placement unit is provided with a plurality of grooves that have openings at the one main surface. When the processing target placement unit is viewed from the one main surface side thereof, a smallest width of the opening of each groove in the one main surface is equal to or less than half a smallest width of the processing target.

In the above-described vacuum device, when the processing target placement unit is viewed from the one main surface side thereof, a state exists where the processing target sufficiently overlaps a part of the processing target placement unit where the grooves are not formed even in the case where the processing target is small in size. Therefore, air remaining between the processing target and the processing target placement unit or between an adhesive member and the processing target placement unit in the case where the processing target has been provided with an adhesive member is evacuated and thermal conduction between the processing target and the processing target placement unit proceeds.

Therefore, an increase in the temperature of the processing target is sufficiently suppressed and the processing target does not reach a high temperature when a sputtering process, a plasma process or the like is performed on the processing target even in the case where the processing target is small in size. In other words, the occurrence of deformation of a resin part inside the processing target due to thermal expansion, the occurrence of re-melting of solder connecting an electronic component to a substrate inside the processing target and so forth are suppressed, and the yield of processing targets is improved.

According to a first preferred form of the first embodiment of the present disclosure, in the vacuum device, one end of each groove preferably extends to the side surface of the processing target placement unit.

In the above-described vacuum device, air remaining between the processing target and the processing target placement unit or between an adhesive member and the processing target placement unit in the case where the processing target is provided with an adhesive member is effectively evacuated from the side surface of the processing target placement unit.

According to a second preferred form of the first embodiment of the present disclosure, in the vacuum device, the grooves are preferably provided in a substantially lattice-like shape.

In the above-described vacuum device, air remaining between the processing target and the processing target placement unit or between an adhesive member and the processing target placement unit in the case where the processing target is provided with an adhesive member is readily captured by the grooves and is effectively evacuated.

According to a third preferred form of the first embodiment and the first and second preferred forms of the first embodiment of the present disclosure, in the vacuum device, when the processing target placement unit is viewed from the one main surface side thereof, the sum of the areas of the openings of the grooves in the one main surface is preferably equal to or less than half the area of the one main surface.

In the above-described vacuum device, when the processing target placement unit is viewed from the one main surface side thereof, a state exists where the processing target overlaps with certainty a part of the processing target placement unit where the grooves are not formed even in the case where the processing target is small in size. Therefore, air remaining between the processing target and the processing target placement unit or between an adhesive member and the processing target placement unit in the case where the processing target is provided with an adhesive member is evacuated and thermal conduction between the processing target and the processing target placement unit proceeds with certainty.

Therefore, an increase in the temperature of the processing target is suppressed with certainty and the processing target does not reach a high temperature when a sputtering process, a plasma process or the like is performed on the processing target even in the case where the processing target is small in size. In other words, the occurrence of deformation of a resin part inside the processing target due to thermal expansion, the occurrence of re-melting of solder connecting an electronic component to a substrate inside the processing target and so forth are suppressed with certainty, and the yield of processing targets is further improved.

According to a second embodiment of the present disclosure, a vacuum device includes a processing target placement unit that is arranged inside a vacuum chamber and a vacuum evacuation unit that is connected to the vacuum chamber. The processing target placement unit has one main surface on which a processing target is placed, another main surface and a side surface that is connected to the one main surface and the other main surface. Recesses, which each have an opening at the one main surface, are provided at a plurality of places on the one main surface. The processing target placement unit further includes flow channels each having an opening in at least either of the other main surface and the side surface of the processing target placement unit. The recesses are connected to the flow channels. When the processing target placement unit is viewed from the one main surface side thereof, a smallest width of the opening of each recess in the one main surface is equal to or less than half a smallest width of the processing target.

In the above-described vacuum device, when the processing target placement unit is viewed from the one main surface side thereof, a state exists where the processing target sufficiently overlaps a part of the processing target placement unit where the recesses are not formed even in the case where the processing target is small in size. Therefore, air remaining between the processing target and the processing target placement unit or between an adhesive member and the processing target placement unit in the case where the processing target is provided with an adhesive member is evacuated and thermal conduction between the processing target and the processing target placement unit proceeds.

Therefore, the same effect as in the vacuum device according to the first embodiment described above is obtained in the vacuum device according to the second embodiment of the present disclosure.

According to a first preferred form of the second embodiment of the present disclosure, in the vacuum device, when the processing target placement unit is viewed from the one main surface side thereof, the recesses in the one main surface are each preferably substantially groove shaped, and a smallest width of the opening of each substantially groove-shaped recess in the one main surface is preferably equal to or less than half a smallest width of the processing target.

In the above-described vacuum device, since the recesses are substantially groove shaped, air remaining between the processing target and the processing target placement unit or between an adhesive member and the processing target placement unit in the case where the processing target is provided with an adhesive member is effectively evacuated.

According to a second preferred form of the second embodiment and the first preferred form of the second embodiment of the present disclosure, in the vacuum device, when the processing target placement unit is viewed from the one main surface side thereof, the sum of the areas of the openings of the recesses in the one main surface is preferably equal to or less than half the area of the one main surface.

In the above-described vacuum device, when the processing target placement unit is viewed from the one main surface side thereof, a state exists where the processing target overlaps with certainty a part of the processing target placement unit where the recesses are not formed even in the case where the processing target is small in size. Therefore, air remaining between the processing target and the processing target placement unit or between an adhesive member and the processing target placement unit in the case where the processing target is provided with an adhesive member is evacuated and thermal conduction between the processing target and the processing target placement unit proceeds with certainty.

Consequently, the same effect as in the vacuum device according to the second preferred form of the first embodiment described above is obtained in the vacuum device according to the second preferred form of the second embodiment of the present disclosure.

According to another preferred form of the first embodiment and the second embodiment and the preferred forms of these embodiments according to the present disclosure, in the vacuum device, the smallest width of the processing target is preferably around 0.25-2.5 mm.

The effects described in the descriptions of the first embodiment and the second embodiment and the preferred forms of these embodiments are obtained in the vacuum device even when the processing target is small in size as stipulated above.

Therefore, air remaining between the processing target and the processing target placement unit or between an adhesive member provided to the processing target and the processing target placement unit is evacuated and thermal conduction between the processing target and the processing target placement unit proceeds. Therefore, an increase in the temperature of the processing target is sufficiently suppressed and the processing target does not reach a high temperature when a sputtering process, a plasma process or the like is performed on the processing target even in the case where the processing target is small in size. In other words, the occurrence of deformation of a resin part inside the processing target due to thermal expansion, the occurrence of re-melting of solder connecting an electronic component to a substrate inside the processing target and so forth are suppressed, and the yield of processing targets is improved.

Other features, elements, characteristics and advantages of the present disclosure will become more apparent from the following detailed description of preferred embodiments of the present disclosure with reference to the attached drawings.

DETAILED DESCRIPTION

Hereafter, characteristics of the present disclosure will be described in more detail by illustrating embodiments of the present disclosure. Examples of vacuum devices to which the present disclosure may be applied include vacuum devices used when performing a sputtering process, a plasma process or the like on a processing target such as an electronic component, but are not limited to these devices.

Embodiment of Vacuum Device

A vacuum device 100 according to an embodiment of the present disclosure will be described using FIG. 1. Here, a case where the vacuum device 100 is a vacuum device used when performing a sputtering process on an electronic component will be described as an example.

Figure 1:
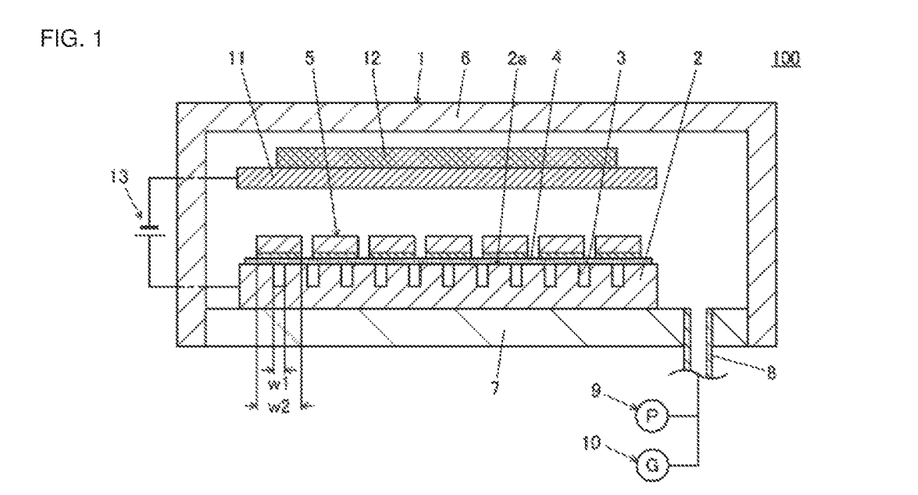
FIG. 1 is a sectional view of a vacuum device according to an embodiment the present disclosure.

FIG. 1 is a sectional view of the vacuum device 100. The vacuum device 100 includes a processing target placement unit 2, a target member 11 and a magnet 12, which are arranged inside a vacuum chamber 1, and a vacuum evacuation unit 9, a gas supplying unit 10 and a direct-current power supply 13, which are connected to the vacuum chamber 1. The vacuum chamber 1 includes a cover member 6, a base member 7 and a pipe section 8, which is a pipe for connecting the vacuum evacuation unit 9 and the gas supplying unit 10 thereto. In FIG. 1, the processing target placement unit 2 is placed on the base member 7 and arranged inside the vacuum chamber 1, but the processing target placement unit 2 may instead be a constituent element of the vacuum chamber 1.

The processing target placement unit 2 doubles as an electrode and the direct-current power supply 13 is connected between the processing target placement unit 2 and the target member 11. For example, Ar gas is supplied at a flow rate of 30-300 sccm by the gas supplying unit 10 into the inside of the vacuum chamber 1, which has been put into a vacuum state of $1 \times 10^{-3}$-$1 \times 10^{-1}$ Pa by the vacuum evacuation unit 9. The direct-current power supply 13 generates a direct-current voltage between the processing target placement unit 2 and the target member 11, and as a result, plasma is generated inside the vacuum chamber 1. The plasma, which is attracted into the vicinity of the target member by lines of magnetic force generated by the magnet 12, effectively collides with the target member 11. As a result, a sputtering process effectively proceeds.

Furthermore, the processing target placement unit 2 includes a cooling mechanism, which is not illustrated. The cooling mechanism suppresses an increase in the temperature of processing targets 5 when the sputtering process is performed. The processing target placement unit 2 and related matters will be described in more detail later.

The material of the target member 11 is appropriately selected depending on the intended purpose. For example, in the case where the processing targets 5 are electronic components, as will be described later, stainless steel, Ti, Cr, Ni, a TiAl alloy, a permalloy or the like may be used as the material of the target member 11 when forming an adhesion layer using a sputtering process. Cu or the like may be used as the material of the target member 11 when forming a shield layer using a sputtering process. Stainless steel, Ti, Cr, Ni, a TiAl alloy, a permalloy or the like may be used as the material of the target member 11 when forming a corrosion resistant layer using a sputtering process.

The form of the processing target placement unit 2 is a feature of the present disclosure. Hereafter, an embodiment of the processing target placement unit 2 will be described using the drawings.

First Embodiment of Processing Target Placement Unit

Figure 2A:
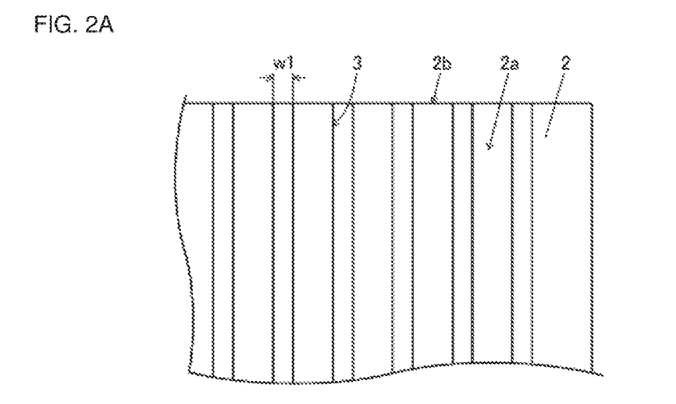
FIG. 2A is an upper surface view of a processing target placement unit according to a first embodiment.
Figure 2B:
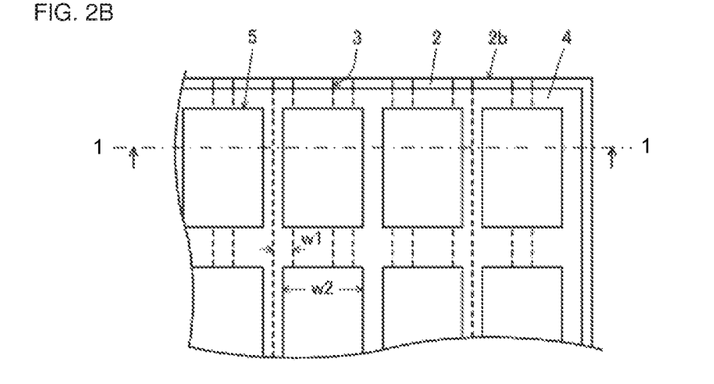
FIG. 2B is an upper surface view illustrating a state in which processing targets have been placed on the processing target placement unit with double-sided adhesive tape interposed therebetween and FIG. 2C is a sectional view of the processing target placement unit with the processing targets placed thereon.
Figure 2C:
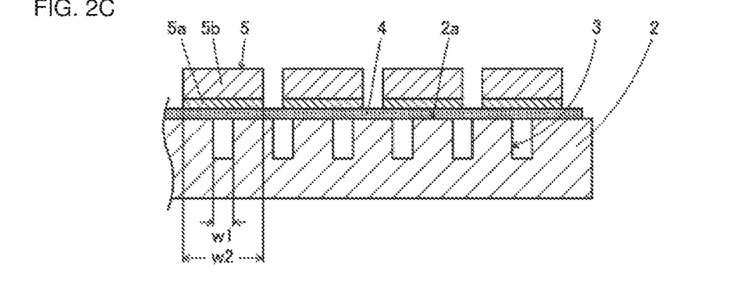

A processing target placement unit 2 according to a first embodiment will be described using FIGS. 2A to 2C. FIG. 2A is an upper surface view of the processing target placement unit 2 according to the first embodiment. FIG. 2B is an upper surface view illustrating a state in which the processing targets 5 have been placed on the processing target placement unit 2 according to the first embodiment with double-sided adhesive tape 4, which is an adhesive member, interposed therebetween. FIG. 2C is a sectional view of a cross section taken along a line 1-1 in FIG. 2B.

An example of the processing target 5 is an electronic component such as the above-mentioned communication module product in which a circuit element (not illustrated) is connected to a substrate 5a using solder and the circuit element is covered by a molding resin 5b. A composite material including a woven fabric or a non-woven fabric such as one composed of glass or silica and an insulating resin such as epoxy resin, a low temperature firing ceramic material and so forth may be used as the material of the substrate 5a. Wiring conductors (not illustrated) may be provided inside and on a surface of the substrate 5a. An insulating resin material in which a glass material, Si oxide or the like has been dispersed as a filler may be used as the molding resin 5b.

The above-described processing targets 5 are manufactured using a known method. In addition, the present disclosure exhibits a particularly excellent effect in the case where small-sized electronic components having a smallest width of around 0.25-2.5 mm are the processing targets.

It is preferable that the material of the processing target placement unit 2 be a metal material having high thermal conductivity such as Al. It is preferable that the surface roughness of the processing target placement unit 2 be as small as possible to ensure that the contact area between the processing target placement unit 2 and the processing targets 5 is large and that thermal conduction effectively proceeds. When Ra represents the surface roughness of the processing target placement unit 2, it is preferable that Ra be around 0.3-10 μm, for example.

In FIGS. 2A to 2C, as described above, the processing targets 5 are placed on the processing target placement unit 2 with double-sided adhesive tape 4, which is an adhesive member, interposed therebetween. It is preferable that the processing targets 5 be placed on double-sided adhesive tape 4 that has been affixed to the processing target placement unit 2 in advance. At this time, it is preferable that the double-sided adhesive tape 4 be affixed to the processing target placement unit 2 in a low-pressure environment in order that the amount of air remaining between the processing target placement unit 2 and the double-sided adhesive tape 4 be made as small as possible. Affixing of the double-sided adhesive tape 4 can be achieved using a known method. In addition, it is preferable that both the processing target placement unit 2 and the double-sided adhesive tape 4 be heated to around 50-80° C., for example when affixing the processing target placement unit 2 and the double-sided adhesive tape 4 to each other in order to increase the adhesive strength.

The processing target placement unit 2 has one main surface 2a on which the processing targets 5 are placed and a side surface 2b that is connected to the one main surface 2a. The processing target placement unit 2 is provided with a plurality of grooves 3 that have openings at the one main surface 2a. As illustrated in FIGS. 2A to 2C, it is preferable that at least one end of each groove 3 extend to the side surface 2b of the processing target placement unit 2 in order to facilitate the evacuation of air remaining between the processing target placement unit 2 and the double-sided adhesive tape 4. However, even if one end of each groove 3 does not reach the side surface 2b of the processing target placement unit 2, remaining air can be evacuated by adjusting the shape of the grooves 3 or the method of affixing the double-sided adhesive tape 4, for example. Places may be provided where openings of the grooves 3 are not covered by the double-sided adhesive tape 4, and air can be evacuated from these places.

The depth of the grooves 3 is preferably larger than the thickness of the glue of the double-sided adhesive tape 4. If the depth of the grooves 3 is small, there is a risk that the glue of the double-sided adhesive tape 4 will fill the grooves 3 due to the pressure acting when the double-sided adhesive tape 4 is affixed to the processing target placement unit 2 and that it will not be possible to sufficiently evacuate the air remaining between the double-sided adhesive tape 4 and the processing target placement unit 2. The thickness of the glue is typically 100-200 μm. Accordingly, the depth of the grooves 3 is preferably around 300-1000 μm.

When the processing target placement unit 2 is viewed from the one main surface 2a side thereof, a smallest width w1 of the opening of each groove 3 in the one main surface (width of opening of groove 3 at arbitrary places in the case of FIGS. 2A to 2C) is equal to or less than half a smallest width w2 of the processing target 5.

When the processing target placement unit 2 has the above-described form, a state exists where the processing targets 5 sufficiently overlap parts of the processing target placement unit 2 where the grooves 3 are not formed even in the case where the processing targets 5 are small in size. Therefore, air remaining between the processing target placement unit 2 and the double-sided adhesive tape 4 is evacuated and thermal conduction between the processing target placement unit 2 and the processing targets 5 proceeds.

Therefore, an increase in the temperature of the processing targets 5 is sufficiently suppressed and the processing targets 5 do not reach a high temperature when a sputtering process is performed on the processing targets 5 even in the case where the processing targets 5 are small in size. In other words, the occurrence of deformation of the molding resin 5b inside the processing targets 5 due to thermal expansion, the occurrence of re-melting of solder connecting electronic components to the substrates 5a inside the processing targets 5 and so forth are suppressed, and the yield of processing targets 5 is improved.

When the processing target placement unit 2 is viewed from the one main surface 2a side thereof, the sum of the areas of the openings of the grooves 3 in the one main surface 2a is preferably equal to or less than half the area of the one main surface 2a. In this case, a state exists in which the processing targets 5 overlap with certainty parts of the processing target placement unit 2 where the grooves 3 are not formed even in the case where the processing targets 5 are small in size. Therefore, thermal conduction between the processing target placement unit 2 and the processing targets 5 proceeds with certainty. Therefore, an increase in the temperature of the processing targets 5 is suppressed with certainty and the processing targets 5 do not reach a high temperature when a sputtering process is performed on the processing targets 5 even in the case where the processing targets 5 are small in size. In other words, the yield of the processing targets 5 is further improved.

Figure 3A:
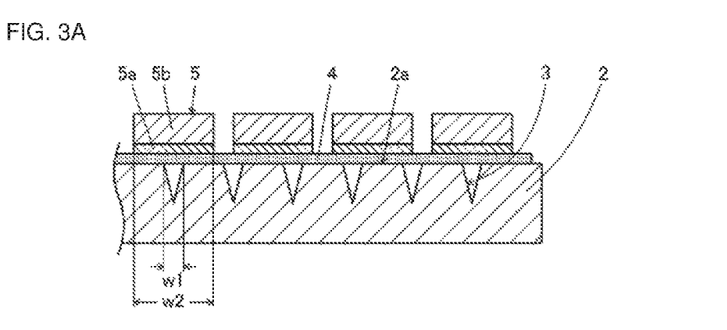
FIGS. 3A and 3B are sectional views of processing target placement units according to a first modification and a second modification of the first embodiment, respectively.
Figure 3B:
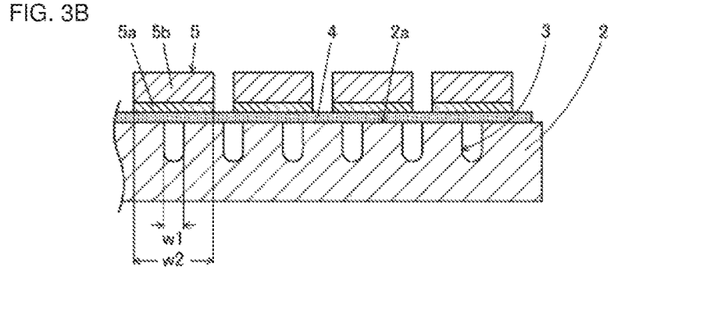

First Modification and Second Modification of First Embodiment of Processing Target Placement Unit Processing target placement units 2 according to a first modification and a second modification of the first embodiment will be described using FIGS. 3A and 3B. FIG. 3A is a sectional view of the processing target placement unit 2 according to the first modification of the first embodiment. FIG. 3B is a sectional view, which corresponds to FIG. 2C, of the processing target placement unit 2 according to the second modification of the first embodiment.

The grooves 3 have a substantially V-shaped cross section in a direction perpendicular to the longitudinal direction of the grooves 3 in the processing target placement unit 2 illustrated in FIG. 3A. In this case, the openings of the grooves 3 in the one main surface 2a of the processing target placement unit 2 are wide but the volume of the grooves 3 in the processing target placement unit 2 is reduced and therefore the heat capacity of the processing target placement unit 2 is increased. Therefore, air remaining between the processing target placement unit 2 and the double-sided adhesive tape 4 is more effectively evacuated and suppression of an increase in the temperature of the processing targets 5 by the processing target placement unit 2 proceeds more effectively.

The grooves 3 have a substantially U-shaped cross section in a direction perpendicular to the longitudinal direction of the grooves 3 in the processing target placement unit 2 illustrated in FIG. 3B. A similar effect to that of the processing target placement unit 2 illustrated in FIG. 3A can be obtained in this case as well.

Third Modification of First Embodiment of Processing target placement Unit

Figure 4A:
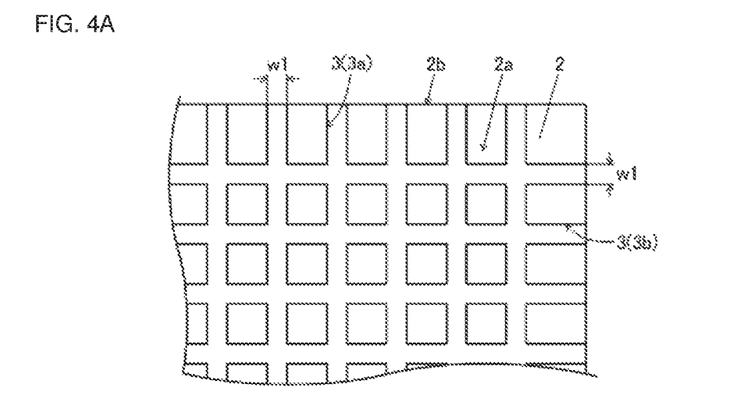
FIG. 4A is an upper surface view of a processing target placement unit according to a third modification of the first embodiment.
Figure 4B:
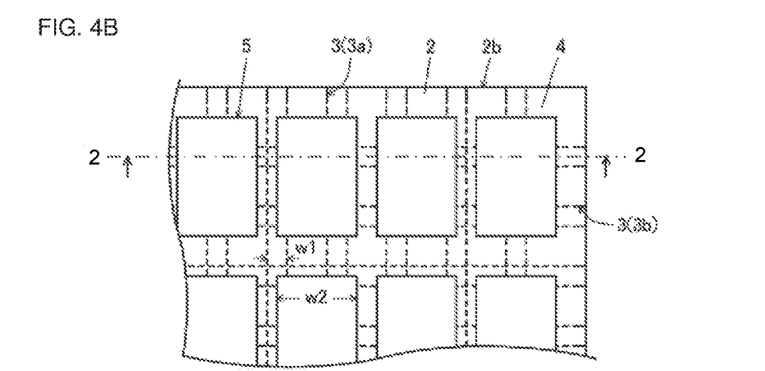
FIG. 4B is an upper surface view illustrating a state in which processing targets have been placed on the processing target placement unit with double-sided adhesive tape interposed therebetween and FIG. 4C is a sectional view of the processing target placement unit with the processing targets placed thereon.
Figure 4C:
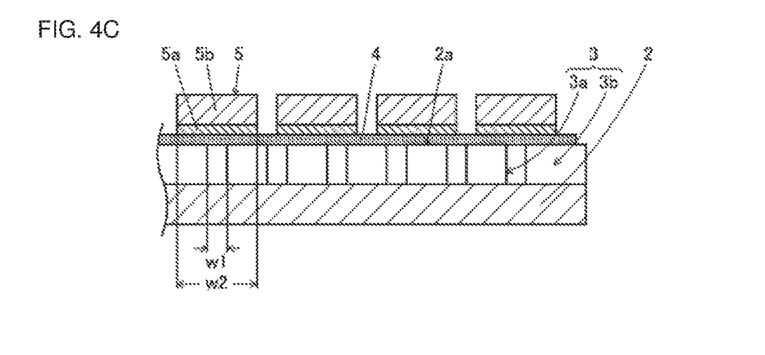

A processing target placement unit 2 according to a third modification of the first embodiment will be described using FIGS. 4A to 4C. FIG. 4A is an upper surface view of the processing target placement unit 2 according to the third modification of the first embodiment. FIG. 4B is an upper surface view illustrating a state in which the processing targets 5 have been placed on the processing target placement unit 2 according to the third modification of the first embodiment with the double-sided adhesive tape 4, which is an adhesive member, interposed therebetween. FIG. 4C is a sectional view of a cross section taken along a line 2-2 in FIG. 4B.

In the processing target placement unit 2 illustrated in FIGS. 4A to 4C, the grooves 3 provided in the one main surface 2a of the processing target placement unit 2 have a substantially lattice-like shape that includes grooves 3a that extend in a first direction and grooves 3b that extend in a second direction that is perpendicular to the first direction. The grooves 3a and the grooves 3b may intersect each other at an angle other than 90°. In addition, in FIG. 4A, the grooves 3a and the grooves 3b both have the width w1, but may instead have different widths from each other. In this case, air remaining between the processing target placement unit 2 and the double-sided adhesive tape 4 is effectively evacuated.

In addition, when the processing target placement unit 2 is viewed from the one main surface 2a side thereof, the sum of the areas of the openings of the substantially lattice-shaped grooves 3 in the one main surface 2a is preferably equal to or less than half the area of the one main surface 2a. In this case as well, a state exists in which the processing targets 5 overlap with certainty parts of the processing target placement unit 2 where the grooves 3 are not formed even in the case where the processing targets 5 are small in size. Therefore, an increase in the temperature of the processing targets 5 is suppressed with certainty and the processing targets 5 do not reach a high temperature when a sputtering process is performed on the processing targets. In other words, the yield of the processing targets 5 is further improved.

Thus far, cases have been described in which the processing targets 5 are placed on the processing target placement unit 2 with the double-sided adhesive tape 4, which is an adhesive member, interposed therebetween in the vacuum devices 100 according to the embodiment and the modifications of the embodiment of the present disclosure. However, the processing targets 5 may instead be placed on the processing target placement unit 2 without the double-sided adhesive tape 4 interposed therebetween in the vacuum device 100 according to the embodiment of the present disclosure.

Figure 5A:
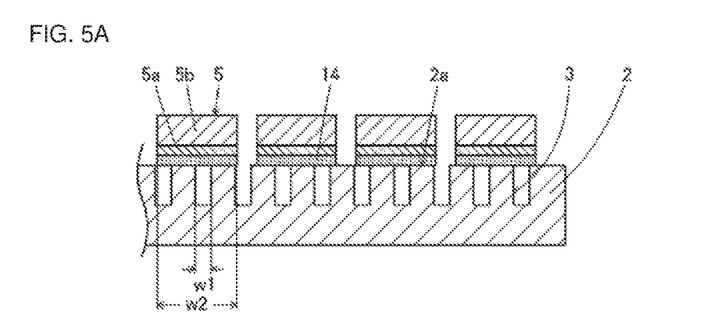
FIG. 5A is a sectional view illustrating a case where processing targets, which have been individually coated with an adhesive, have been placed on a processing target placement unit
Figure 5B:
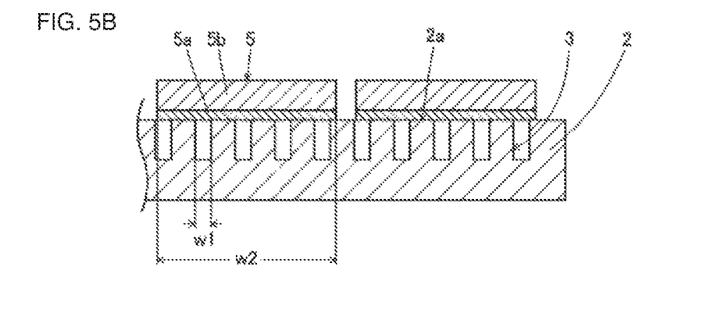
FIG. 5B is a sectional view illustrating a case where processing targets that have not been provided with adhesive members have been placed on a processing target placement unit.

Such an example will be described using FIGS. 5A and 5B. FIG. 5A is a sectional view illustrating a case in which the processing targets 5, which have been each individually coated with an adhesive 14, which is an adhesive member, are placed on the processing target placement unit 2 according to the first embodiment. FIG. 5B is a sectional view illustrating a case in which the processing targets 5, which have not been provided with adhesive members, are placed on the processing target placement unit 2 according to the first embodiment.

The effect of the present disclosure of achieving both evacuation of air and securing of thermal conduction is obtained when the smallest width w1 of the openings of the grooves 3 is equal to or less than half the smallest width w2 of the processing targets 5 even in the case where the processing targets 5 have been each individually coated with the adhesive 14 as illustrated in FIG. 5A. In this case, remaining air is evacuated from parts of the openings of the grooves 3, in the one main surface 2a of the processing target placement unit 2, that are not covered by the processing targets 5 even in the case where an end of each groove 3 does not extend to the side surface 2b of the processing target placement unit 2. In addition, the effect of the present disclosure is similarly obtained even in the case of processing targets 5 that are not provided with adhesive members.

Second Embodiment of Processing Target Placement Unit

Figure 6A:
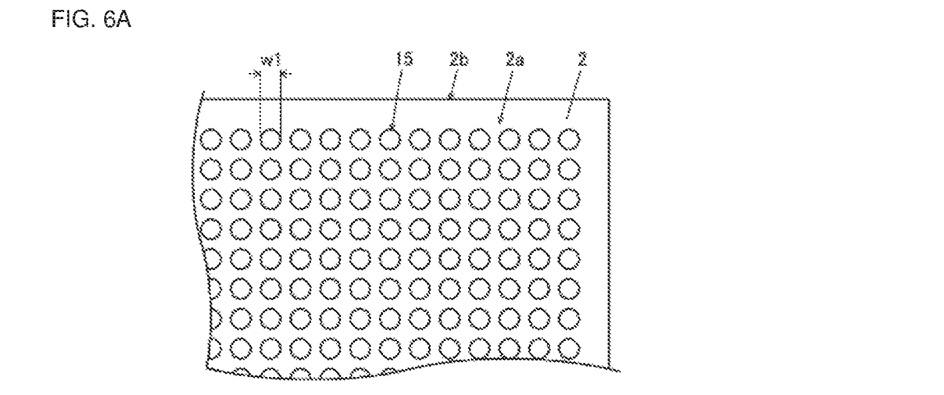
FIG. 6A is an upper surface view of a processing target placement unit according to a second embodiment.
Figure 6B:
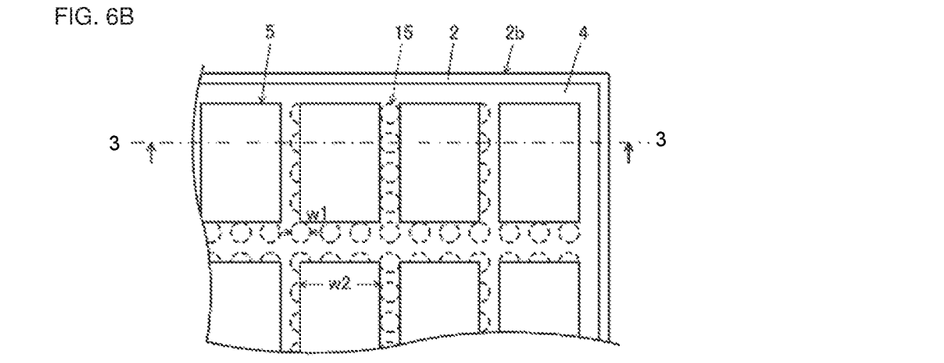
FIG. 6B is an upper surface view illustrating a state in which processing targets have been placed on the processing target placement unit with double-sided adhesive tape interposed therebetween and FIG. 6C is a sectional view of the processing target placement unit with the processing targets placed thereon.
Figure 6C:
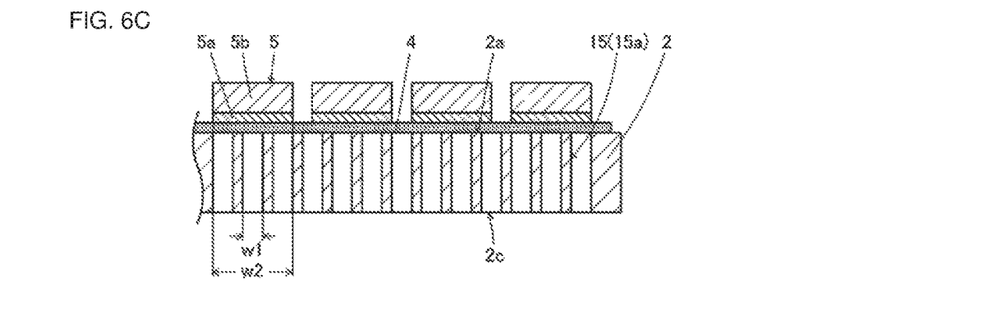

A processing target placement unit 2 according to a second embodiment will be described using FIGS. 6A to 6C. FIG. 6A is an upper surface view of the processing target placement unit 2 according to the second embodiment. FIG. 6B is an upper surface view illustrating a state in which the processing targets 5 have been placed on the processing target placement unit 2 according to the second embodiment with double-sided adhesive tape 4, which is an adhesive member, interposed therebetween. FIG. 6C is a sectional view of a cross section taken along a line 3-3 in FIG. 6B.

The material of the processing target placement unit 2 according to the second embodiment is the same as in the first embodiment and therefore description thereof will be omitted here. In addition, in FIGS. 6A to 6C, the processing targets 5 are placed on the processing target placement unit 2 with double-sided adhesive tape 4, which is an adhesive member, interposed therebetween. However, as described using FIGS. 5A and 5B, the effect described hereafter is similarly obtained in a case where the processing targets 5 are coated with the adhesive 14 and in a case where the processing targets 5 are not provided with adhesive members.

The processing target placement unit 2 illustrated in FIGS. 6A to 6C has one main surface 2a on which the processing targets 5 are placed, another main surface 2c and a side surface 2b that is connected to the one main surface 2a and the other main surface 2c. Recesses 15, which each have an opening at the one main surface 2a, are provided at a plurality of places on the one main surface 2a. In addition, the processing target placement unit 2 is further provided with flow channels 15a that each have an opening at the other main surface 2c. The recesses 15 are connected to the flow channels 15a. It is sufficient that the openings of the flow channels 15a be located at at least either of the other main surface 2c and the side surface 2b of the processing target placement unit 2. In addition, in the processing target placement unit 2 illustrated in FIGS. 6A to 6C, the openings of the recesses 15 have a substantially circular shape, and the recesses 15 and the flow channels 15a are integrated with each other and form single cylindrical through holes that extend from the one main surface 2a to the other main surface 2c. However, the shape of the openings of the recesses 15 is not limited to this.

When the processing target placement unit 2 is viewed from the one main surface 2a side thereof, a smallest width w1 of the openings of the recesses 15 in the one main surface 2a (diameter of openings of circular recesses 15 in the case illustrated in FIGS. 6A to 6C) is equal to or less than half a smallest width w2 of the processing target 5.

When the processing target placement unit 2 has the above-described form, a state also exists where the processing targets 5 sufficiently overlap parts of the processing target placement unit 2 where the recesses 15 are not formed even in the case where the processing targets 5 are small in size, similarly to the case of the first embodiment. Therefore, air remaining between the processing target placement unit 2 and the double-sided adhesive tape 4 is evacuated and thermal conduction between the processing target placement unit 2 and the processing targets 5 proceeds.

Therefore, the same effect as in the vacuum device according to first embodiment described above is obtained in the vacuum device according to the second embodiment of the present disclosure as well.

The sum of the areas of the openings of the recesses 15 in the one main surface 2a is preferably equal to or less than half the area of the one main surface 2a in the case where the processing target placement unit 2 has the above-described form as well, similarly to the case of the first embodiment. In this case as well, a state exists in which the processing targets 5 overlap with certainty parts of the processing target placement unit 2 where the recesses 15 are not formed even in the case where the processing targets 5 are small in size. Therefore, an increase in the temperature of the processing targets 5 is suppressed with certainty and the processing targets 5 do not reach a high temperature when a sputtering process is performed on the processing target 5. In other words, the yield of the processing targets 5 is further improved.

Modification of Second Embodiment of Processing Target Placement Unit

Figure 7A:
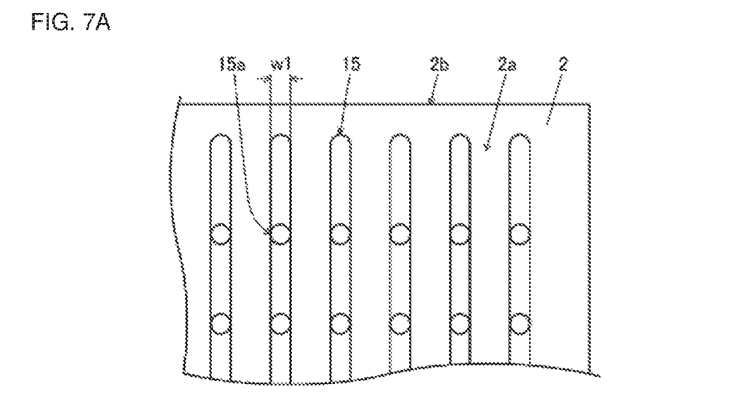
FIG. 7A is an upper surface view of a processing target placement unit according to a modification of the second embodiment.
Figure 7B:
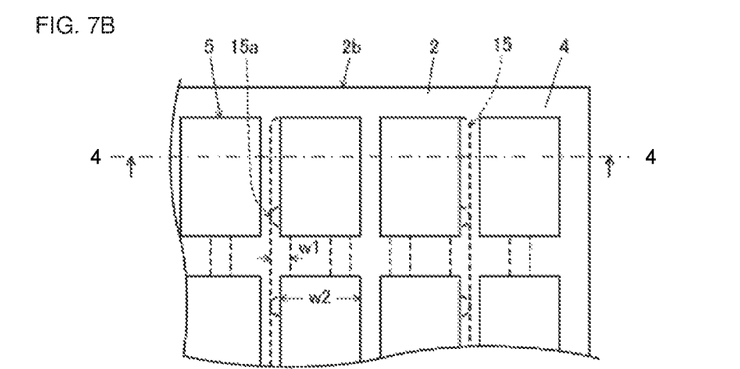
FIG. 7B is an upper surface view illustrating a state in which processing targets have been placed on the processing target placement unit with double-sided adhesive tape interposed therebetween and FIG. 7C is a sectional view of the processing target placement unit with the processing targets placed thereon.
Figure 7C:
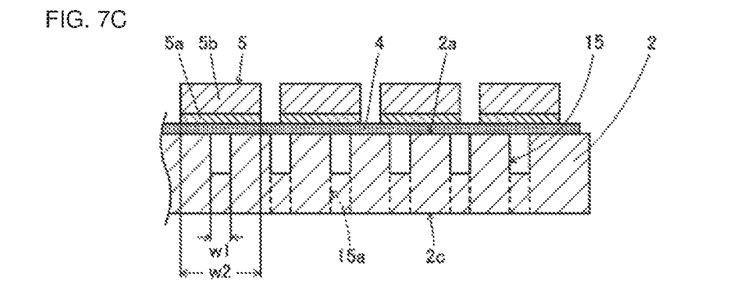

A processing target placement unit 2 according to a modification of the second embodiment will be described using FIGS. 7A to 7C. FIG. 7A is an upper surface view of the processing target placement unit 2 according to the modification of the second embodiment. FIG. 7B is an upper surface view illustrating a state in which the processing targets 5 have been placed on the processing target placement unit 2 according to the modification of the second embodiment with the double-sided adhesive tape 4 interposed therebetween. FIG. 7C is a sectional view of a cross section taken along a line 4-4 in FIG. 7B.

In the processing target placement unit 2 illustrated in FIGS. 7A to 7C, when the processing target placement unit 2 is viewed from the one main surface 2a side thereof, the recesses 15 in the one main surface 2a are substantially groove shaped and the smallest width w1 of the openings of the groove-shaped recesses 15 in the one main surface 2a is equal to or less than half the smallest width w2 of the processing target 5. In this case, air remaining between the processing target placement unit 2 and the double-sided adhesive tape 4 is effectively evacuated since the recesses 15 are substantially groove shaped.

The sum of the areas of the openings of the substantially groove-shaped recesses 15 in the one main surface 2a is preferably equal to or less than half the area of the one main surface 2a in the case where the processing target placement unit 2 has the above-described form as well, similarly to as in the case of the second embodiment. In this case as well, a state exists in which the processing targets 5 overlap with certainty parts of the processing target placement unit 2 where the substantially groove-shaped recesses 15 are not formed even in the case where the processing targets 5 are small in size. Therefore, an increase in the temperature of the processing targets 5 is suppressed with certainty and the processing targets 5 do not reach a high temperature when a sputtering process is performed on the processing targets 5. In other words, the yield of the processing targets 5 is further improved.

EXPERIMENTAL EXAMPLE

Next, an embodiment of the present disclosure will be described more specifically on the basis of an experimental example. In this experimental example, a Cu film was formed on the surface of a processing target by a sputtering device that uses a vacuum device equipped with a processing target placement unit having various groove widths and numbers of grooves. Differences in the surface temperature of the processing target under various conditions were investigated.

The processing target was obtained by providing an insulating resin, which contains silica as a filler, as a molding resin on a PCB substrate having a thickness of around 0.4 mm. In addition, the processing target had a length of 10 mm, a width of 6 mm and a height of 1.5 mm. The processing target was subjected to a sputtering process in a state where the processing target had been placed on and affixed to the processing target placement unit by double-sided adhesive tape. At this time, it was ensured that the processing target was positioned above a groove.

The sputtering process was performed under conditions of a power of 25 kW, a Cu film deposition time of 900 s, a pressure of 1.5 Pa and a spacing between the target member and the processing target of 50 mm. In addition, the surface temperature was measured by affixing a thermo-label to the surface of the processing target and checking the temperature after the sputtering process. The measurement results of the surface temperature of the processing target under the various conditions are illustrated in the Table.

nator and the width of the groove is the numerator expressed as a percentage was 50% or less (conditions 1-6). The surface temperature of the processing target was 120° C. or less in cases where the number of grooves was small and a ratio in which the surface area of the one main surface of the processing target placement unit is the denominator and the sum of the surface areas of the grooves is the numerator expressed as a percentage was 50% or less (conditions 1-5). In other words, it was clear that an increase in the temperature of a processing target is suppressed with certainty by applying an embodiment of the present disclosure when a processing target is subjected to a sputtering process.

The present disclosure is not limited to the above-described embodiments and various applications and modifications of the present disclosure can be added within the scope of the present disclosure. In addition, the embodiments described in the present specification are illustrative examples and it should be noted that parts of the configurations illustrated in different embodiments can be substituted for one another or combined with one another.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A vacuum device comprising:
a processing target placement unit arranged inside a vacuum chamber, and having one main surface on which a plurality of processing targets are placed and a side surface that is connected to the one main surface, and that is provided with a plurality of grooves each having an opening at the one main surface, and an adhesive member which adheres the processing target placement unit to the plurality of processing targets provided on the one main surface of the processing target placement unit;
a target member configured for performing a sputtering process; and
an evacuation unit that is connected to the vacuum chamber;
wherein, when the processing target placement unit is viewed from the one main surface side thereof, the groove has an area that does not overlap with the adhesive member, and the groove has an area that overlaps with the adhesive member,

TABLE

| Condition No. | Width of Grooves (mm) | Width of Grooves/ Width of Processing Target (%) | Number of Grooves (Number/10 mm) | Surface Area of Grooves/Area of One Main Surface (%) | Surface Temperature of Processing Target (° C.) |
|---|---|---|---|---|---|
| 1 | 1.5 | 25 | 2 | 30 | 75 |
| 2 | | | 3 | 45 | 85 |
| 3 | | | 4 | 60 | 100 |
| 4 | 3.0 | 50 | 1 | 30 | 95 |
| 5 | | | 1.5 | 45 | 120 |
| 6 | | | 2 | 60 | 150 |
| * 7 | 4.5 | 75 | 0.67 | 30 | 170 |
| * 8 | | | 1 | 45 | 185 |
| * 9 | | | 1.3 | 60 | 200 |

Width of processing target: 6 mm
* Denotes case outside of scope of present disclosure.

As illustrated in the Table, the surface temperature of the processing target was 150° C. or less in cases where a ratio in which the width of the processing target is the denomiwherein, when the processing target placement unit is viewed from the one main surface side thereof, a smallest width of the opening of each groove in the one main surface is equal to or less than half a smallest width of each of the plurality of processing targets, and the plurality of processing targets are configured to be subjected to the sputtering process from the target member that is arranged opposite from the processing target placement unit in the vacuum chamber.

2. The vacuum device according to claim 1,
wherein one end of each groove extends to the side surface of the processing target placement unit.

3. The vacuum device according to claim 1,
wherein the grooves are provided in a substantially lattice-like shape.

4. The vacuum device according to claim 1,
wherein, when the processing target placement unit is viewed from the one main surface side thereof, a sum of areas of the openings of the grooves in the one main surface is equal to or less than half an area of the one main surface.

5. A vacuum device comprising:
a processing target placement unit arranged inside a vacuum chamber, and having one main surface on which a plurality of processing targets are placed, another main surface and a side surface that is connected to the one main surface and the other main surface, and that is provided in a plurality of places with recesses each having an opening at the one main surface, and an adhesive member which adheres the processing target placement unit to the plurality of processing targets provided on the one main surface of the processing target placement unit;
a target member configured for performing a sputtering process; and
an evacuation unit that is connected to the vacuum chamber;
wherein, when the processing target placement unit is viewed from the one main surface side thereof, the opening has an area that does not overlap with the adhesive member and the opening has an area that overlaps with the adhesive member,
wherein the processing target placement unit further includes flow channels each having an opening in at least either of the other main surface and the side surface of the processing target placement unit,
the recesses are connected to the flow channels,
when the processing target placement unit is viewed from the one main surface side thereof, a smallest width of the opening of each recess in the one main surface is equal to or less than half a smallest width of each of the plurality of processing targets, and
the plurality of processing targets are configured to be subjected to the sputtering process from the target member that is arranged opposite from the processing target placement unit in the vacuum chamber.

6. The vacuum device according to claim 5,
wherein, when the processing target placement unit is viewed from the one main surface side thereof, the recesses in the one main surface are each substantially groove shaped, and
a smallest width of the opening of each substantially groove-shaped recess in the one main surface is equal to or less than half a smallest width of each of the plurality of processing targets.

7. The vacuum device according to claim 5,
wherein, when the processing target placement unit is viewed from the one main surface side thereof, a sum of areas of the openings of the recesses in the one main surface is equal to or less than half an area of the one main surface.

8. The vacuum device according to claim 1,
wherein the smallest width of the processing target is around 0.25-2.5 mm.

* * * * *